United States Patent
Flewelling

(12) 
(10) Patent No.: US 10,911,028 B1
(45) Date of Patent: Feb. 2, 2021

(54) PHASE ADJUSTMENT PRESET FOR N-PATH FILTER

(71) Applicant: BAE SYSTEMS Information and Electronic Systems Integration Inc., Nashua, NH (US)

(72) Inventor: Gregory M. Flewelling, Freeport, ME (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/719,320

(22) Filed: Dec. 18, 2019

(51) Int. Cl.
| | |
|---|---|
| *H03H 17/02* | (2006.01) |
| *H03K 3/037* | (2006.01) |
| *H03K 5/01* | (2006.01) |
| *H03K 5/00* | (2006.01) |
| *H03D 7/00* | (2006.01) |

(52) U.S. Cl.
CPC .............. *H03H 17/02* (2013.01); *H03K 3/037* (2013.01); *H03K 5/01* (2013.01); *H03D 7/00* (2013.01); *H03K 2005/00286* (2013.01)

(58) Field of Classification Search
CPC ............ H03K 5/01; H03K 5/02; H03K 5/023; H03K 3/037; H03H 17/02–0217; H03H 17/0219–0283
See application file for complete search history.

(56) References Cited

U.S. PATENT DOCUMENTS

| 8,471,607 | B1* | 6/2013 | Pace | H03K 21/026 |
| | | | | 327/115 |
| 2002/0041340 | A1* | 4/2002 | Suzuki | H03J 5/24 |
| | | | | 348/731 |
| 2016/0118990 | A1* | 4/2016 | Faisal | H03L 7/0997 |
| | | | | 327/156 |
| 2017/0005408 | A1* | 1/2017 | Gomadam | H01Q 21/0006 |
| 2017/0207751 | A1* | 7/2017 | Kuppambatti | H03F 3/45179 |
| 2019/0371348 | A1* | 12/2019 | Shahbazi Mirzahasanloo | |
| | | | | H04W 84/12 |

* cited by examiner

*Primary Examiner* — Patrick C Chen
(74) *Attorney, Agent, or Firm* — Maine Cernota & Rardin; Scott J. Asmus

(57) ABSTRACT

A device for phase adjustment preset for an N-path filter comprising a logic block; a ring divider array creating a local oscillator drive for a mixer; the ring divider array comprising: a plurality of registers, each comprising: inputs S, R, D, and clock, and output Q; the plurality of registers comprising at least: a first register; a second register; and an Nth register; a preset control word; wherein the preset control word is applied to the logic block, the logic block providing input to each of the S and the R inputs of each the register; whereby a desired starting phase of the divider is controlled. A method includes defining a desired starting conditions; determining a control word from desired starting conditions; applying control word to logic block; applying a reset signal to logic block; and outputting values for each of S and R to each register.

20 Claims, 5 Drawing Sheets

EMBODIMENT BLOCK DIAGRAM

TIMING DIAGRAM

100

PHASE ALWAYS RETURNS TO Q<0> = 1 = 0 DEGREES

PRIOR ART CIRCUIT BLOCK DIAGRAM

EMBODIMENT BLOCK DIAGRAM

TIMING DIAGRAM

4-BIT EMBODIMENT LOGIC

METHOD FLOW CHART

PHASE ADJUSTMENT PRESET FOR N-PATH FILTER

STATEMENT OF GOVERNMENT INTEREST

This invention was made with government support under Prime Contract Number FA8650-17-C-7709 awarded by DARPA. The United States Government has certain rights in the inventions.

FIELD OF THE DISCLOSURE

This disclosure relates to signal processing, more particularly, to a phase adjustment preset for an N-Path filter.

BACKGROUND

When resetting an N-Path filter, the filter typically goes to a fixed phase relative to the input clock. In applications, it may be desirable to intentionally introduce a phase shift at reset, so as to change the alignment between channels. Applications include correcting phase offsets within the system, assisting with beam steering in a phase array, or techniques in an Electronic Warfare (EW) system.

When phase is shifted, typically it is shifted in the digital domain or with an analog phase shifter.

What is needed is a device, method, and system for a phase adjustment preset for an N-Path filter providing low overhead phase shifting using an existing circuit within the N-Path mixer.

SUMMARY

An embodiment provides a device for phase adjustment preset for an N-path filter comprising a logic block; a ring divider array providing a local oscillator drive for a mixer; the ring divider array comprising a plurality of registers, each comprising input set (S), reset (R), data (D), and clock, and output (Q); the plurality of registers comprising at least a first register; and an Nth register; a preset control word; wherein the preset control word is applied to the logic block, the logic block providing input to each of the S and the R inputs of each the register; whereby a desired starting phase of the divider is controlled. In embodiments the preset control word determines the phase adjustment. In other embodiments, the logic block takes settings from manual settings. In subsequent embodiments the logic block takes settings from an autonomous controller. For additional embodiments the logic block takes settings from a machine learning algorithm autonomous controller. Another embodiment comprises writing arbitrary reset words into the ring divider. For a following embodiment a transfer function through the N-Path mixer is not a traditional RF->I/Q or I/Q->RF. In subsequent embodiments the device provides 1/N*360 resolution on a phase of a channel, where N is an order of the N-Path filter. In additional embodiments the device provides four bits by including exactly four registers. Included embodiments comprise four bits wherein CW=00, S=1000, and R=0111 for a starting phase of 0 degrees; CW=01, S=0100, R=1011 for a starting phase of 45 degrees; CW=10, S=0010, R=1101 for a starting phase of 90 degrees; CW=11, S=0001, and R=1110 for a starting phase of 135 degrees. In yet further embodiments the registers comprise at least one JK flip-flop. In related embodiments output of the device provides at least one of phase correction; and beam steering in a phase array. For further embodiments the device output provides input to an electronic warfare system comprising phase control in a digital radio frequency memory. In ensuing embodiments the divider array comprises D-type flip-flop registers; the logic block comprises a reset input and a control word input; the logic block providing S and R inputs to the D-type flip-flops; and wherein clock inputs to the D-type flip-flop registers alternate between clock and clockN.

Another embodiment provides a method for phase adjustment preset for an N-path filter comprising providing a ring divider creating a local oscillator drive for a mixer; defining a desired starting condition; determining a control word (CW) from desired starting conditions; applying the CW to a logic block; applying a reset signal to the logic block; outputting values for each of S and R to each of a plurality of registers when a next clock edge is applied; and releasing the ring divider to clock in a new CW; whereby a desired starting phase of the ring divider is controlled. For yet further embodiments, the starting conditions comprise one of a starting phase; a CW whereby zeros are clocked around the ring divider whereby the mixer is disabled by providing no local oscillator output; and a CW whereby only ones are output, allowing an input of the mixer to pass to an output. For more embodiments, an output Q of each register is input to a next register input D, except a last register output Q is directly connected back to a first register input D. In continued embodiments the method provides 1/N*360 resolution on a phase of a channel, where N is an order of the N-Path filter. For additional embodiments, the method for phase adjustment preset comprises four bits wherein CW=00, S=1000, and R=0111 for a starting phase of 0 degrees; CW=01, S=0100, R=1011 for a starting phase of 45 degrees; CW=10, S=0010, R=1101 for a starting phase of 90 degrees; CW=11, S=0001, R=1110 for a starting phase of 135 degrees.

A yet further embodiment provides a system for phase adjustment preset for an N-path filter comprising providing a logic block; a ring divider array creating a local oscillator drive for a mixer; the ring divider array comprising a plurality of registers, each comprising inputs S, R, D, and clock, and output Q; the plurality of registers comprising at least a first register; a second register; and an Nth register; a preset control word; defining a desired starting conditions; determining the control word from desired starting conditions; applying the control word to the logic block; applying a reset signal to the logic block; the logic block providing input to each of the S and the R inputs of each the register; and outputting values for each of the S and the R to each the register; wherein the system provides 1/N*360 resolution on a phase of a channel, where N is an order of the N-Path filter; and whereby a desired starting phase of the divider is controlled.

These and other features of the present embodiments will be understood better by reading the following detailed description, taken together with the figures herein described.

The accompanying drawings are not intended to be drawn to scale. For purposes of clarity, not every component may be labeled in every drawing.

DETAILED DESCRIPTION

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The invention is susceptible of many embodiments. What follows is illustrative, but not exhaustive, of the scope of the invention.

Embodiments comprise employing a ring divider to create the Local Oscillator (LO) drive for a mixer, and using a preset word and logic to put the starting position of the ring divider into a different stage of the ring. This provides 1/N*360 resolution on the phase of the channel, where N is the order of the N-Path filter. In embodiments, the "LOGIC" block in the diagrams takes settings from either manual settings or an autonomous controller such as a machine learning algorithm to control the desired starting phase of the divider.

Embodiments can also write arbitrary reset words into the ring divider (so it is not just a one-shot divider). In embodiments, this allows for a different transfer function through the N-Path mixer than the traditional RF->I/Q or I/Q->RF.

Figure 1:
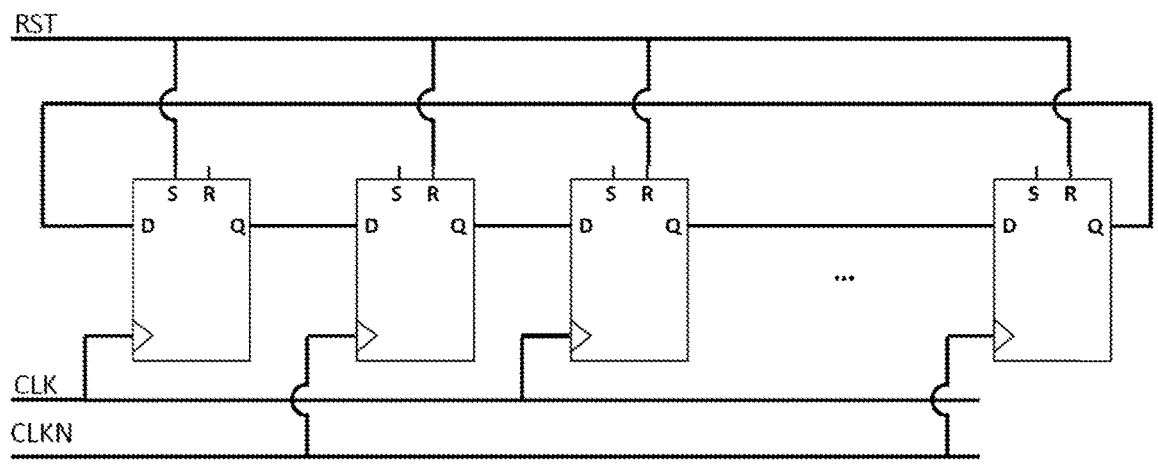
FIG. 1 is a prior art block diagram and timing diagram.
Figure 1:
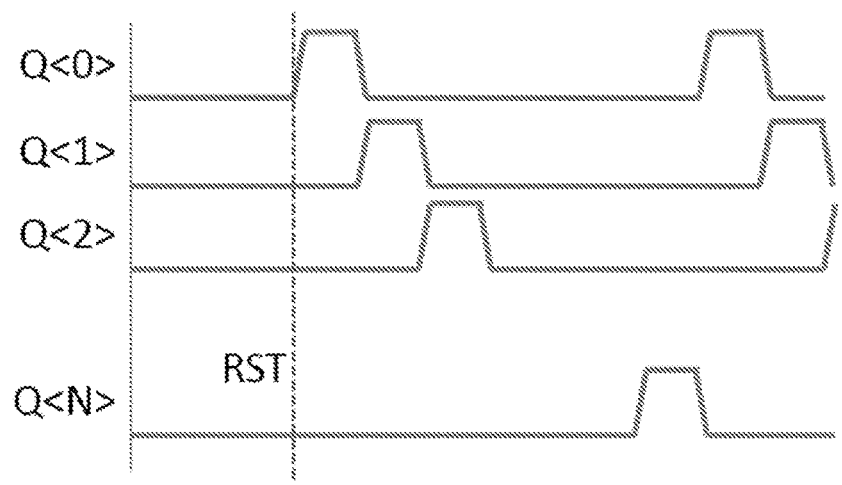

FIG. 1 is a prior art ring counter divider circuit block diagram and timing diagram 100 illustrating D-type flip-flops, each comprising input reset (R) from reset (RST) and from output (Q) plus a clock signal. The output Q of each flip-flop is connected to the next flip-flop input D, except the last flip-flop output Q is directly connected back to the first flip-flop input D. As shown in the timing diagram, the phase always returns to Q<O>=1=0 degrees.

Figure 2:
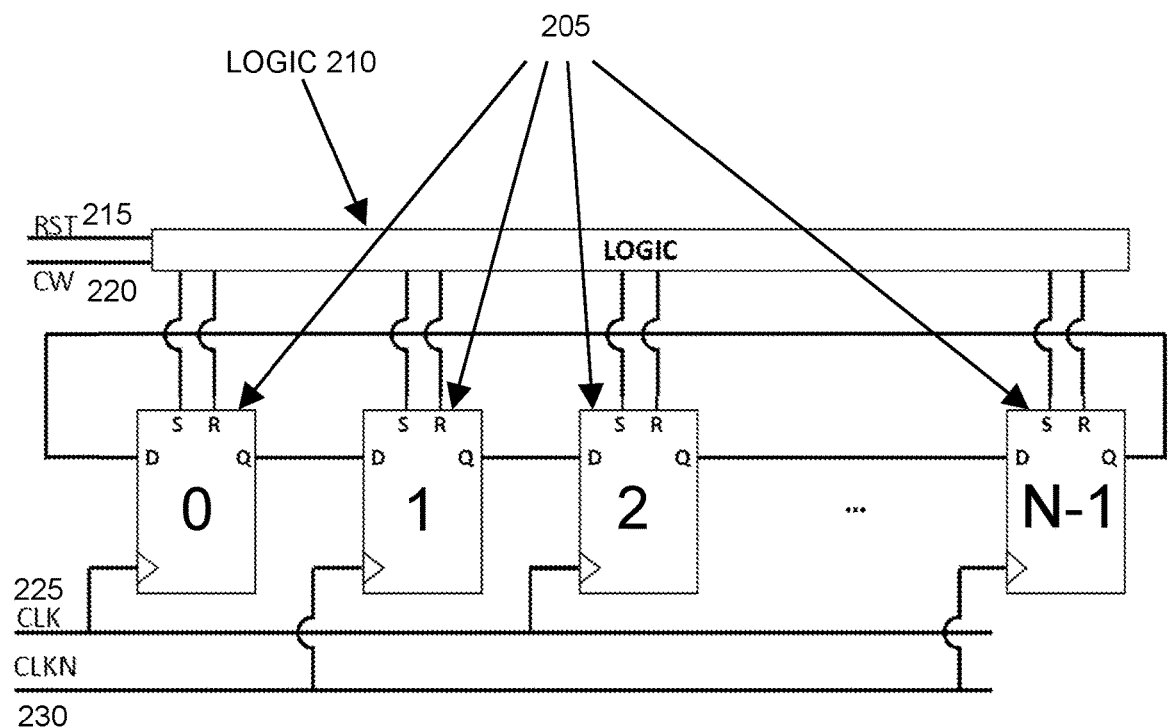
FIG. 2 is a block diagram configured in accordance with an embodiment.

FIG. 2 is a block diagram 200 of one embodiment of the present system. It illustrates D-type flip-flop registers 205 in the divider array, each comprising input set (S), reset (R), data (D), and output (Q) plus a clock input. LOGIC 210 comprises inputs RST 215 and Control Word (CW) 220. LOGIC 210 provides S and R inputs to D-type flip-flops 205. Other signals comprise clock signal CLK 225 and CLKN (180 degree phase difference from CLK) 230. Clock inputs to D-type flip-flops 205 alternate between CLK 225 and CLKN 230. In this depiction there are four D-type flip-flops 205: 0, 1, 2, and N−1. The number of flip-flops in the divider increases with the value of N for the mixer. Embodiments include a 2-path filter with two registers, where the starting phase is either 0 degrees or 180 degrees. Embodiments comprise JK flip-flops rather than SR flip-flops, whereby invalid conditions of S R inputs is avoided.

Figure 3:
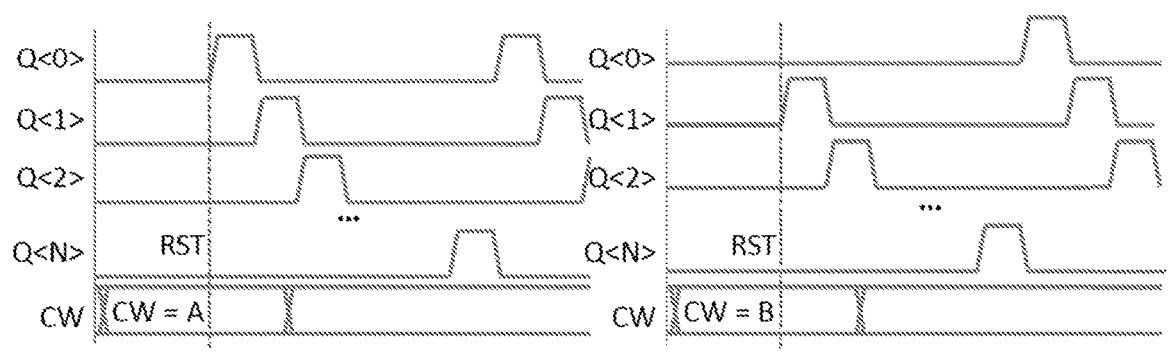
FIG. 3 is a timing diagram configured in accordance with an embodiment.

FIG. 3 is a timing diagram 300. The phase is controlled with a Control Word and implementation of LOGIC. In embodiments the LOGIC provides a phase shift based on the Control Word. As shown, for Control Word A at reset we have Q<0>, Q<1>, Q<2>, . . . Q<N−1> values of 100 . . . 0; for Control Word B at reset we have Q<0>, Q<1>, Q<2>, . . . Q<N−1> values of 010 . . . 0.

Figure 4:
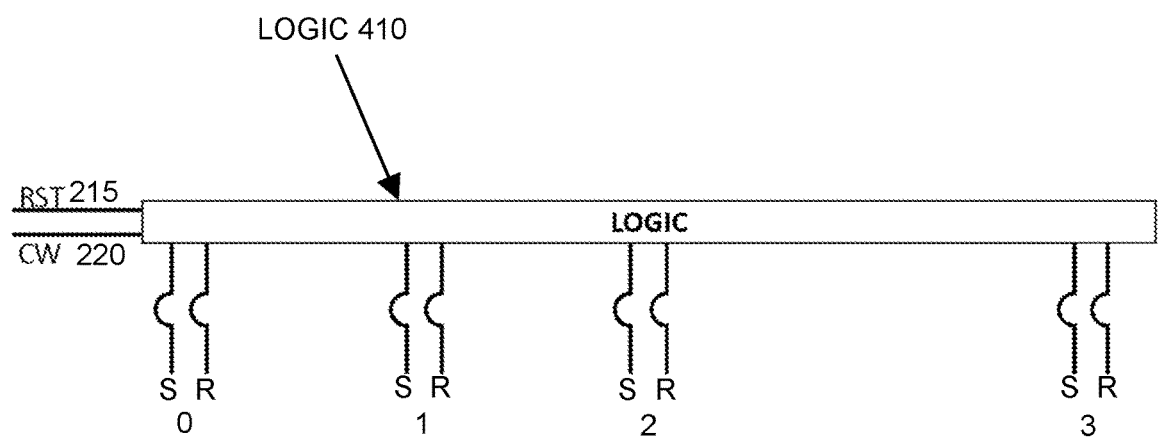
FIG. 4 depicts LOGIC block detail configured in accordance with an embodiment.

FIG. 4 depicts LOGIC block detail 400. The LOGIC block takes the control word (CW) 220 along with the reset signal (RST) 215, and converts it to the desired starting conditions. This is a variable pattern, based on the desired starting phase. It is also dependent on the number of registers in the divider array. Values for a 4-bit example embodiment are shown in Table 1.

TABLE 1

| CW | S | R | Starting Phase Degrees |
|---|---|---|---|
| 00 | 1000 | 0111 | 0 |
| 01 | 0100 | 1011 | 45 |
| 10 | 0010 | 1101 | 90 |
| 11 | 0001 | 1110 | 135 |

Figure 5:
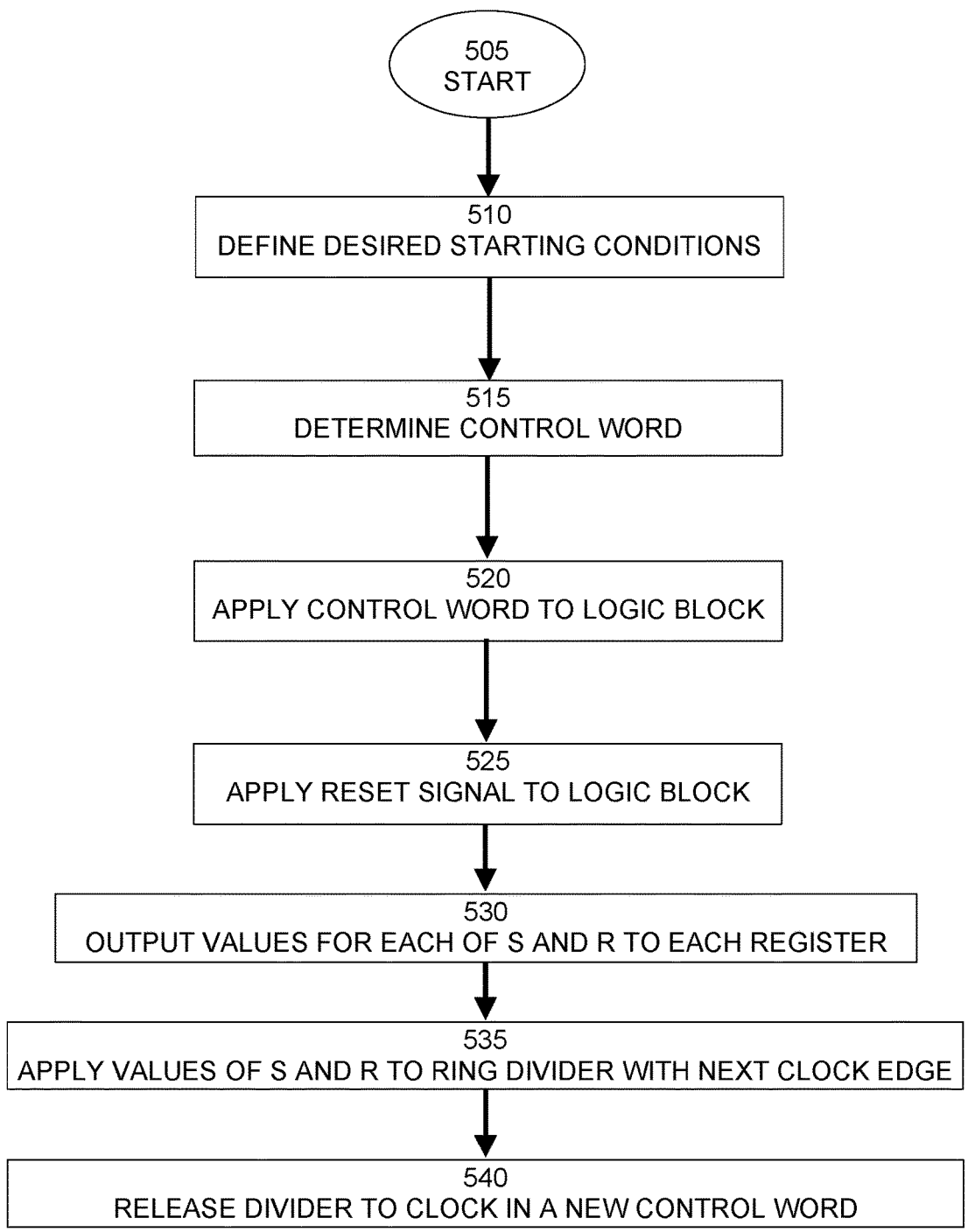
FIG. 5 is a flow chart depicting a method configured in accordance with an embodiment.

FIG. 5 is a flow chart depicting a method 500. Steps comprise START 505; define desired starting conditions, including starting phase 510; determine Control Word from desired starting conditions 515; apply Control Word to LOGIC block 520; apply reset signal to LOGIC block 525 and output values for each of S and R to each register 530. The values of S and R are then applied to the ring divider when the next clock edge is applied 535; and releasing the divider to clock in a new Control Word 540. Embodiments comprise writing arbitrary reset words into the ring divider where two or more registers are on at once. Embodiments also include an autonomous controller that takes other inputs from the system including timing, state, and/or signal environment conditions and makes a decision on the best settings for the ring divider to achieve a desired performance outcome. In embodiments this decision is made based on machine learning algorithms and/or externally programmed information. In embodiments the autonomous controller is also used to adjust the phase settings and apply the reset at a time that is undirected by the system, but necessary due to some other timing, state, and/or signal environment information that is provided to the algorithm. For embodiments the goal is to protect the case where parts of the system control are pushed into the chip. A number of on-chip measurement techniques are used for calibration, or even rapid response to a new signal/threat. In embodiments, the chip may not have time to tell the system controller that it needs to do something different, and would just respond immediately.

The flowchart and block diagrams in the Figures illustrate the architecture, functionality, and operation of possible implementations of systems, methods, according to various embodiments of the present invention.

The foregoing description of the embodiments has been presented for the purposes of illustration and description. It is not intended to be exhaustive or to limit the invention to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure. Other and various embodiments will be readily apparent to those skilled in the art, from this description, figures, and the claims that follow. It is intended that the scope of the invention be limited not by this detailed description, but rather by the claims appended hereto.

What is claimed is:

1. A device for phase adjustment preset for an N-path filter comprising:
   a logic block;
   a ring divider array providing a Local Oscillator (LO) drive for an N-path mixer;
   said ring divider array comprising:
      a plurality of registers, each comprising:
         input set (S), reset (R), data (D), and clock, and output (Q);
      said plurality of registers comprising at least:
         a first register; and
         an Nth register;
   a preset control word;
   wherein said preset control word is applied to said logic block, said logic block providing input to each of said S and said R inputs of each said plurality of registers;
   wherein a desired starting phase of said divider is controlled by said logic block; and
   wherein said device provides a phase shift for the N-path mixer.

2. The device of claim 1, wherein said preset control word determines said phase adjustment preset.

3. The device of claim 1, wherein said logic block takes settings from manual settings.

4. The device of claim 1, wherein said logic block takes settings from an autonomous controller.

5. The device of claim 1, wherein said logic block takes settings from a machine learning algorithm autonomous controller.

6. The device of claim 1 wherein said ring divider includes a plurality of written arbitrary reset words.

7. The device of claim 1, wherein a transfer function through said N-Path mixer is not a traditional direct conversion mixer that only converts an RF input spectrum to an I/Q baseband spectrum or an I/Q baseband spectrum to an RF output spectrum.

8. The device of claim 1 wherein said device provides 1/N*360 resolution on a phase of a channel, where N is an order of said N-Path filter.

9. The device of claim 1 wherein said device provides the four bits by including exactly four registers.

10. The device of claim 1 comprising four bits wherein:
    CW=00, S=1000, and R=0111 for a starting phase of 0 degrees;
    CW=01, S=0100, R=1011 for a starting phase of 45 degrees;
    CW=10, S=0010, R=1101 for a starting phase of 90 degrees;
    CW=11, S=0001, R=1110 for a starting phase of 135 degrees.

11. The device of claim 1, wherein said plurality of registers comprise at least one JK flip-flop.

12. The device of claim 1, wherein an output of said device provides at least one of:
    phase correction; and
    beam steering in a phase array.

13. The device of claim 1, wherein an output of said device provides input to an electronic warfare system comprising phase control in a digital radio frequency memory.

14. The device of claim 1, wherein:
    said divider array comprises D-type flip-flop registers;
    said logic block comprises a reset input and a control word input;
    said logic block providing S and R inputs to said D-type flip-flops; and
    wherein clock inputs to said D-type flip-flop registers alternate between clock and clockN.

15. A method for phase adjustment preset for an N-path filter comprising:
    providing a ring divider creating a Local Oscillator (LO) drive for an N-path mixer;
    defining a desired starting condition;
    determining a control word (CW) from desired starting conditions;
    applying said CW to a logic block;
    applying a reset signal to said logic block;
    outputting values for each of input set (S) and reset (R) to each of a plurality of registers when a next clock edge is applied; and
    releasing said ring divider to clock in a new CW;
    wherein a desired starting phase of said divider is controlled by said logic block, and
    wherein said device provides a phase shift for the N-path mixer.

16. The method of claim 15, wherein said starting conditions comprise one of:
    a starting phase;
    a CW whereby zeros are clocked around said ring divider whereby said mixer is disabled by providing no local oscillator output; and
    a CW whereby only ones are output, allowing an input of said mixer to pass to an output.

17. The method of claim 15, wherein an output Q of each register is input to a next register input D, except a last register output Q is directly connected back to a first register input D.

18. The method of claim 15, wherein said method provides 1/N*360 resolution on a phase of a channel, where N is an order of said N-Path filter.

19. The method of claim 15, wherein said method for phase adjustment preset comprises four bits wherein:
    CW=00, S=1000, and R=0111 for a starting phase of 0 degrees;
    CW=01, S=0100, R=1011 for a starting phase of 45 degrees;
    CW=10, S=0010, R=1101 for a starting phase of 90 degrees;
    CW=11, S=0001, R=1110 for a starting phase of 135 degrees.

20. A method for phase adjustment preset for an N-path filter comprising:
    providing:
    a logic block;
    a ring divider array creating a Local Oscillator (LO) drive for an N-path mixer;
    wherein said ring divider array comprises
       a plurality of registers, each comprising:
          input set (S), reset (R), data (D), and clock, and output (Q);

wherein said plurality of registers comprises at least:
- a first register;
- a second register; and
- an Nth register;

a preset control word;

defining a desired starting conditions;

determining said control word from desired starting conditions;

applying said control word to said logic block;

applying a reset signal to said logic block;

wherein said logic block provides input to each of said S and said R inputs of each said register; and outputting values for each of said S and said R to each said register;

wherein said system provides 1/N*360 resolution on a phase of a channel, where N is an order of said N-Path filter;

wherein a desired starting phase of said divider is controlled by said logic block; and wherein said device provides a phase shift for the N-path mixer.

* * * * *